(12) United States Patent
Wu (10) Patent No.: US 7,939,423 B2
(45) Date of Patent: May 10, 2011

(54) METHOD FOR MANUFACTURING NONVOLATILE SEMICONDUCTOR MEMORY DEVICE STRUCTURE

(75) Inventor: Yider Wu, Chu-Pei (TW)

(73) Assignee: Eon Silicon Solution Inc. (TW)

( * ) Notice: Subject to any disclaimer, the term of this patent is extended or adjusted under 35 U.S.C. 154(b) by 0 days.

(21) Appl. No.: 12/761,460

(22) Filed: Apr. 16, 2010

(65) Prior Publication Data

US 2010/0197108 A1 Aug. 5, 2010

Related U.S. Application Data

(62) Division of application No. 11/789,471, filed on Apr. 20, 2007, now abandoned.

(51) Int. Cl.
*H01L 21/76* (2006.01)

(52) U.S. Cl. ......... 438/439; 438/424; 438/425; 438/426

(58) Field of Classification Search ............. 257/314, 257/315, 319, 390; 365/63, 185; 438/439, 438/257, 424–426

See application file for complete search history.

(56) References Cited

U.S. PATENT DOCUMENTS

| 5,150,178 | A * | 9/1992 | Mori ........................... 257/315 |
| 6,222,225 | B1 * | 4/2001 | Nakamura et al. .......... 257/315 |
| 6,342,715 | B1 * | 1/2002 | Shimizu et al. .............. 257/314 |
| 6,518,618 | B1 * | 2/2003 | Fazio et al. .................. 257/315 |
| 6,720,610 | B2 * | 4/2004 | Iguchi et al. ................. 257/315 |
| 6,767,791 | B1 * | 7/2004 | Wu et al. ...................... 438/257 |
| 7,148,104 | B2 * | 12/2006 | Ding ............................ 438/257 |

* cited by examiner

*Primary Examiner* — Thanh V Pham
*Assistant Examiner* — Errol Fernandes
(74) *Attorney, Agent, or Firm* — Schmeiser, Olsen & Watts, LLP

(57) ABSTRACT

A non-volatile semiconductor manufacturing method comprises the steps of making element isolation/insulation films that partitions element-forming regions in a semiconductor substrate; stacking a floating gate on the semiconductor substrate via a first gate insulating film; stacking a second gate insulating film formed on the floating gate, and stacking a control gate formed on the floating gate via the second gate insulating film, and self-aligning source and drain diffusion area with the control gate. In the process of stacking a floating gate by partially etching a field oxide film in a select gate area, followed by floating gate formed in a element-forming region and select gate region, and followed by a chemical mechanical polish(CMP) process, both floating gate and select gate is hereby formed simultaneously. Thereby, when memory cells are miniaturized, the invention allows the process to be simple and reduce the defect density.

4 Claims, 10 Drawing Sheets

METHOD FOR MANUFACTURING NONVOLATILE SEMICONDUCTOR MEMORY DEVICE STRUCTURE

CROSS-REFERENCE TO RELATED APPLICATION

This divisional application claims priority to U.S. application Ser. No. 11/789,471 filed on Apr. 20, 2007, the entire disclosure of which is incorporated herein by reference.

FIELD OF THE INVENTION

The present invention generally relates to nonvolatile semiconductor memory device. More particularly, it pertains to a method of an improve NAND select gate formation.

BACKGROUND OF THE INVENTION

This invention relates to a nonvolatile semiconductor memory device and its manufacturing method.

There is known an electrically rewritable, nonvolatile semiconductor memory (Flash) using memory cells of a stacked-gate structure stacking floating gates and control gates. This kind of Flash uses a tunneling insulation film as a first gate insulating film between floating gates and a semiconductor substrate and typically uses, as the second gate insulating film between floating gates and control gates, an ONO film which is a multi-layered film of a silicon oxide film (O) on a silicon nitride film (N) on a silicon oxide film (O).

Each memory cell is formed in an element-forming region partitioned by an element isolation/insulation film. In general, a floating gate electrode film is divided in the direction of control gate line (word line) by making a slit on the element isolation/insulation film. In the step of making the slit, division of floating gates in the bite-line direction is not yet done. Then a control gate electrode film is stacked via an ONO film on all surfaces of the substrate including the top of the slit-processed floating gate electrode film, and by sequentially etching the control gate electrode film, ONO film, and floating gate electrode film, control gates and floating gates are then isolated in the bit-line direction. After that, source and drain diffusion layers are formed in self-alignment with the control gates.

Figure 1:
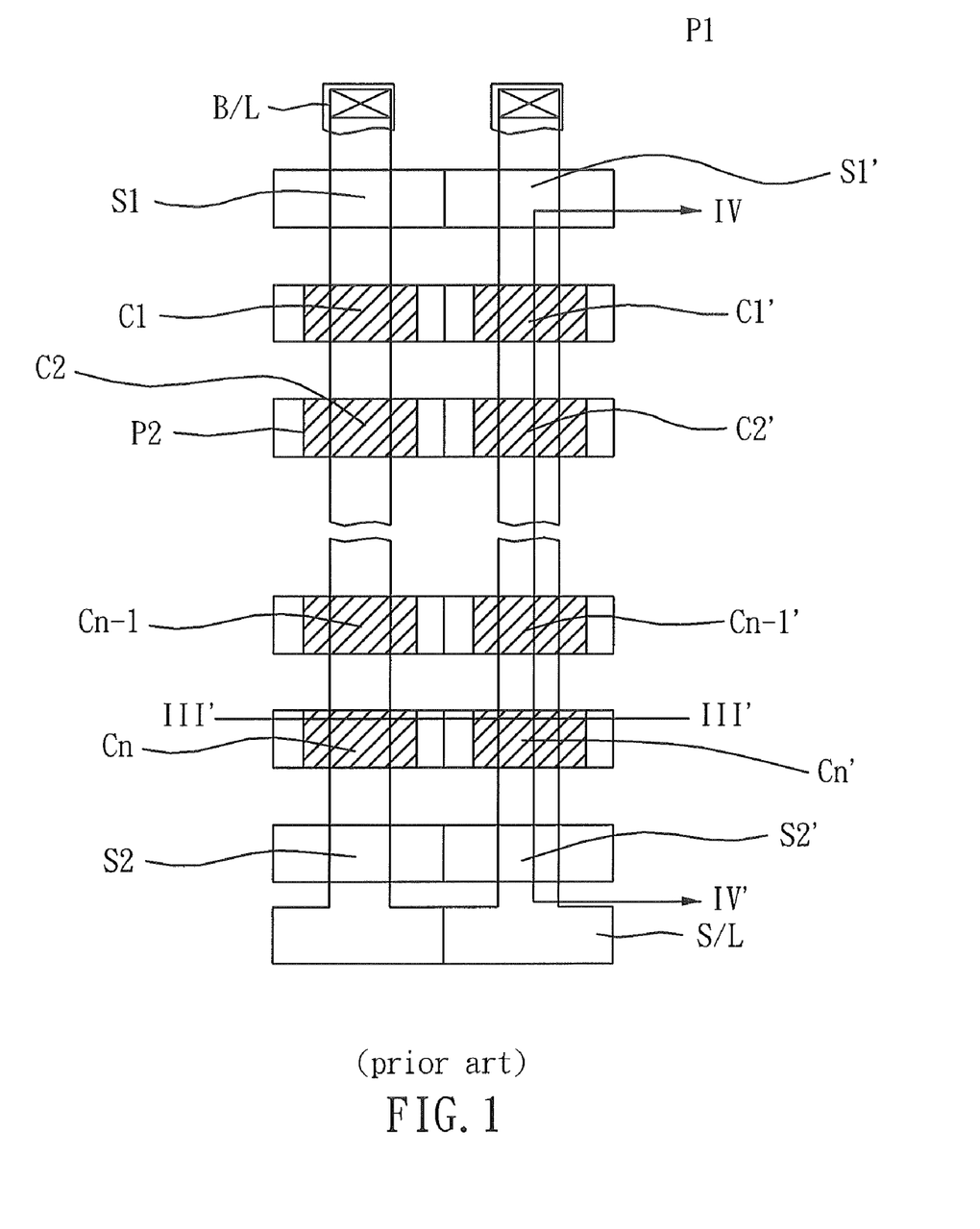
FIG. 1 is a schematic view of the layout of a conventional NAND nonvolatile memory device.
Figure 2A:
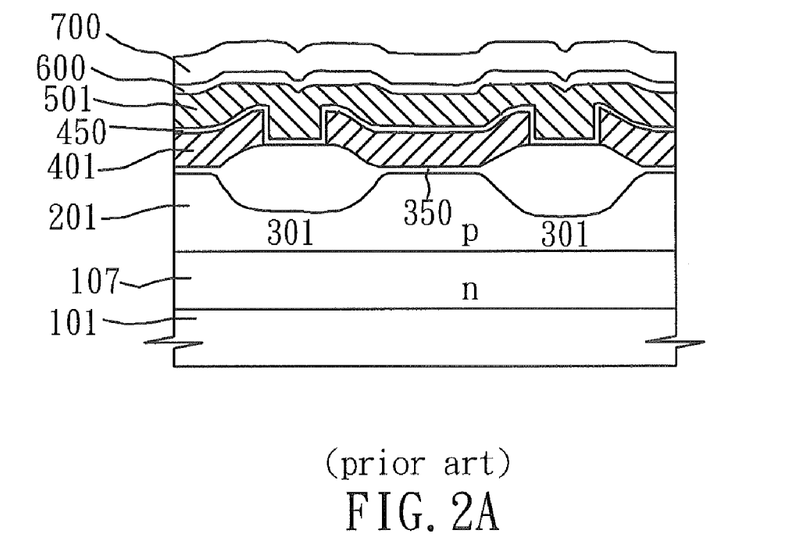
FIGS. 2A and 2B are sectional views taken along lines III-III' and IV-IV' of FIG. 1 respectively of the conventional nonvolatile memory device and select device.
Figure 2B:
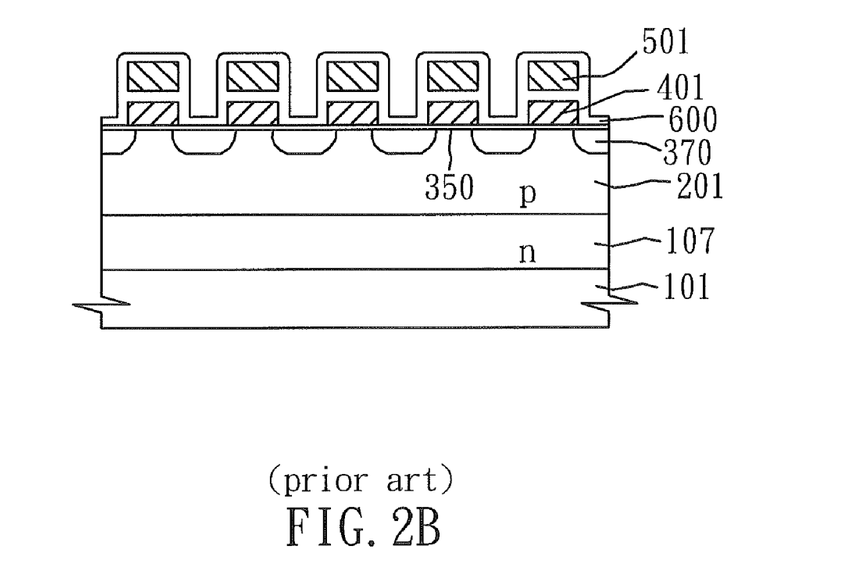

FIG. 1 is a schematic view of a conventional method for manufacturing a non volatile semiconductor memory device structure, wherein FIGS. 2A and 2B are schematic sectional views of cutting lines taking along III-III' and IV-IV' of FIG. 1. FIG. 2A is a sectional view taken along line III-III' of FIG. 1, and FIG. 2B is a sectional view taken along line IV-IV'. FIGS. 2A and 2B, reference numeral 101 denotes a P-type semiconductor substrate, reference numeral 107 denotes an N-well, reference numeral 201 denotes a P-well, reference numeral 301 denotes a field oxide film for dividing the semiconductor substrate into an active region and a non-active region, reference numeral 350 denotes a gate insulating film, reference numeral 370 denotes a source/drain region, reference numeral 401 denotes a floating gate, reference numeral 450 denotes an inter-dielectric layer, reference numeral 501 denotes a control gate, and reference numeral 600 denotes a first insulating film.

Refer to FIGS. 2A and 2B, on the P-type (or alternatively, N-type) semiconductor substrate 101, an ion implantation is performed at various steps, the field oxide 301, the gate insulation 350, the floating gate 401, the inter-dielectric layer 450 and the control gate 501 are sequentially deposited. On each side of the gates, N-type (or alternatively, P-type) source/drain regions 370 are formed. The first insulating film 600 is formed on the source/drain regions 370, on the sidewalls of both the floating gate 401, the control gate 501 and on top of the control gate 501 as shown in FIG. 2B.

The first insulating film 600 acts as a dielectric layer to electrically isolate the source/drain 370, the floating gate 401 and the control gate 501 from the PA-plate 700. The first insulating film 600 has a predetermined permittivity and consists of, for example, an oxide film, a nitride film, an oxynitride film, an oxide-nitride-oxide laminate (ONO) films or a combination of such films such as a nitride film and an oxide film.

Figure 3A:
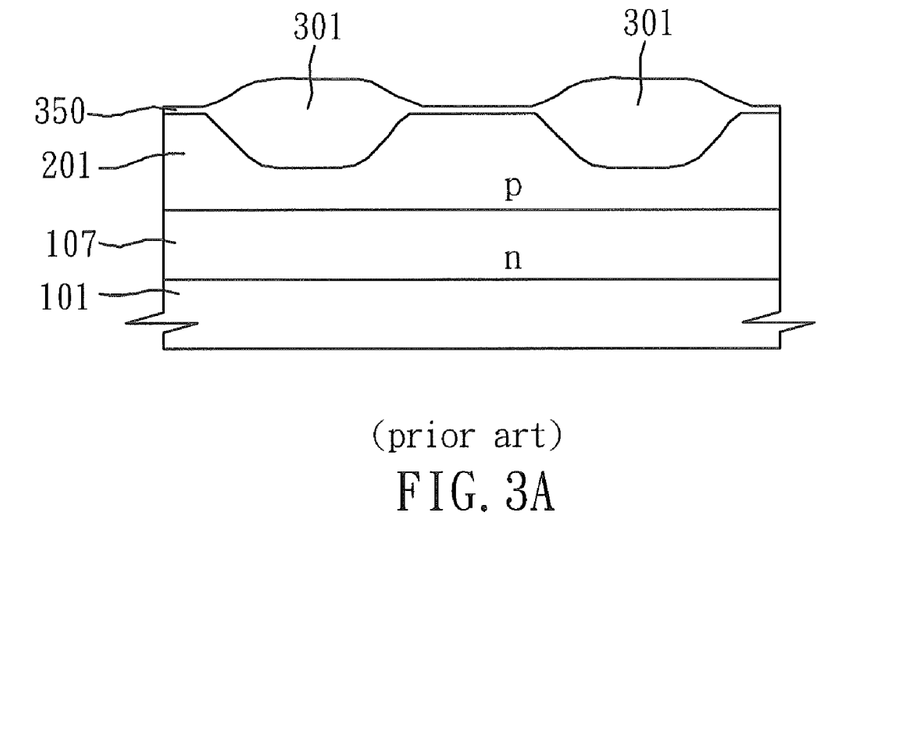

FIGS. 3A-5B are sectional views for illustrating the conventional manufacturing method of a nonvolatile memory device. FIGS. 3A, 4A and 5A are sectional views taken along the cutting line III-III' of FIG. 1, and FIGS. 3B, 4B and 5B are sectional views taken along the cutting line IV-IV' of FIG. 1.

Figure 3B:
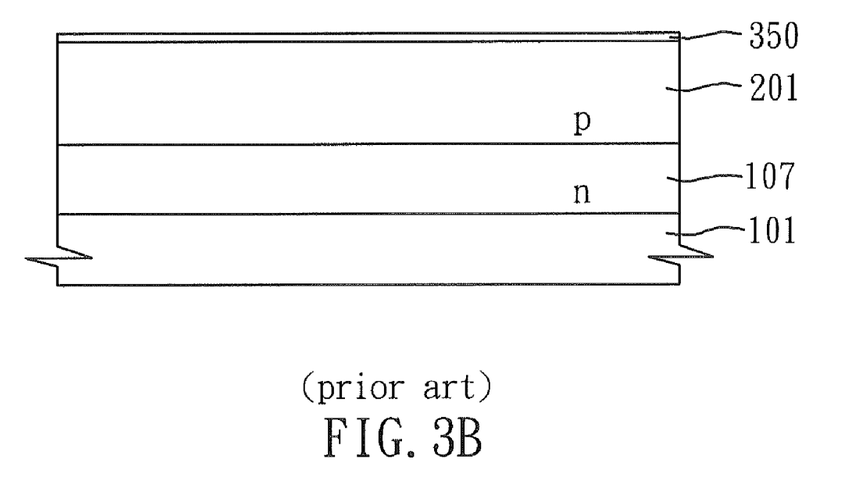

FIGS. 3A and 3B show a step of forming a field oxide film 301 and a gate oxide film 350 on a P-type portion 201 of a semiconductor substrate 101. Alternatively, the structures are formed on an N-type portion of a semiconductor substrate without departing from the scope of this invention.

Referring to FIGS. 3A and 3B, a second conductivity type well 107 is formed in a first conductivity type semiconductor substrate 101, and a first conductivity type well 201 is formed in the second conductivity type well 107. A field oxide film 301 is formed on a surface of the substrate where the first and second conductivity type wells are formed for a purpose of electrically isolating the active devices, and a gate oxide film 350 is formed on the resultant structure. The gate oxide film 350 can be formed before forming the field oxide film 301.

FIGS. 3A and 3B show N-type impurities implanted into a predetermined region of a P-type semiconductor substrate 101 by using the photolithography and the ion-implantation methods. The ion-implanted region is diffused to a desired depth by heat treating at a high temperature in order to form the N-well 107. The P-well 201 is formed by using the same method on a predetermined region of the N-well 107. The isolation film 301 is formed by an isolation method, for example, shallow trench isolation (STI), and a thin thermal oxide film is grown on the entire surface of the formed isolation film to form a gate oxide film 350 on the isolation film.

Figure 4A:
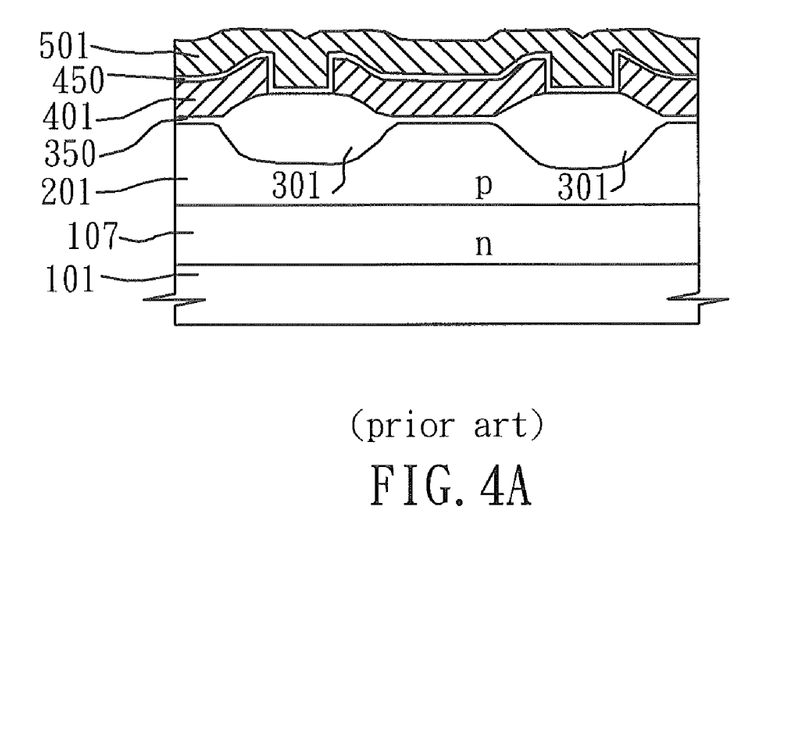
Figure 4B:
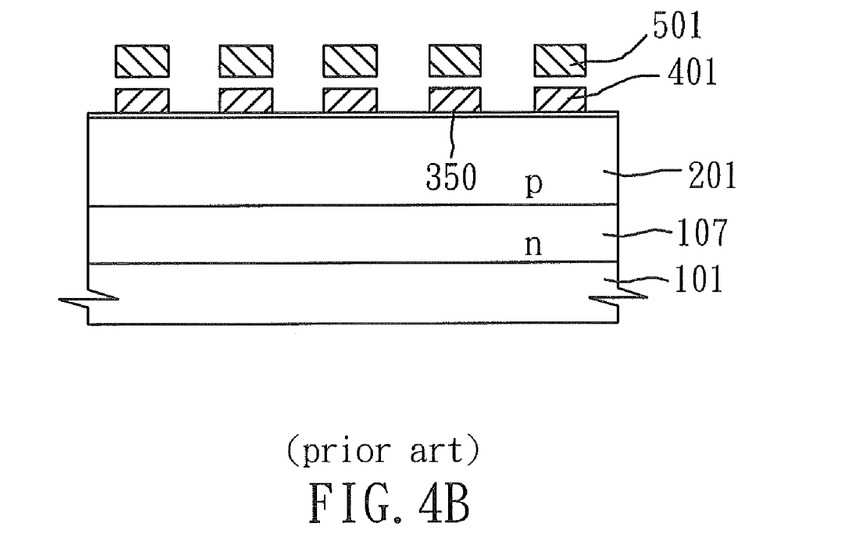
Figure 5A:
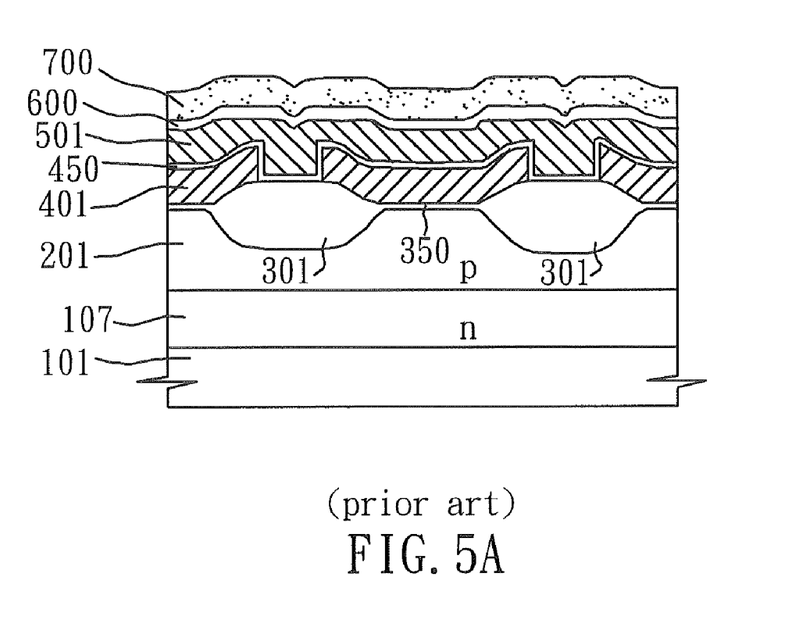
Figure 5B:
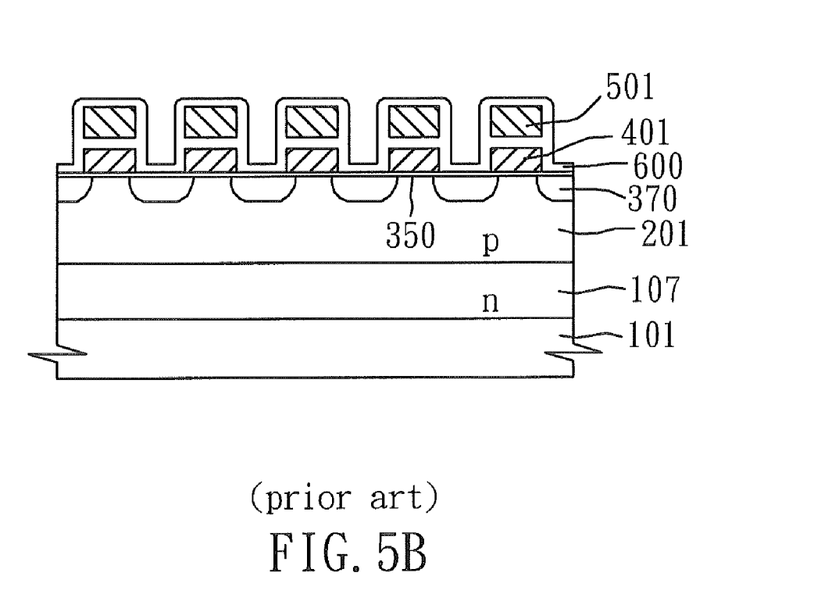

FIGS. 4A and 4B show the steps of forming a floating gate 401, an inter-dielectric layer 450 and a control gate 501. A floating gate 401 is formed on the gate oxide film 350; an inter-dielectric layer 450 having a predetermined thickness is formed on the isolation film 301, the gate oxide film 350 and the floating gate 401; and a control gate 501 is formed on the inter-dielectric layer 450.

FIGS. 4A and 4B, a conductive material is used for forming a gate electrode, wherein polysilicon is used and doped with impurities, and the polysilicon is then deposited on the gate oxide film 350 and patterned by a chemical mechanical polish (CMP) process for forming a floating gate so that, the formation of the floating gate 401 can be achieved. An insulation film is deposited on the floating gate 401, such as a sequentially deposited oxide film, nitride film and oxide film (ONO film) to form an inter-dielectric layer 450. The inter-dielectric layer 450 insulates the floating gate 401 from the control gate 501, and acts as a dielectric layer over the floating gate 401.

The select transistors operate as typical transistors rather than as floating gate storage devices. Therefore, in the areas where select transistors are to be formed part of, the control gate 501 and the inter-dielectric 450 are patterned to create contact holes so that a contact between the floating gate 401 and the select transistor is created.

The conventional method of forming a nonvolatile memory device, additional processes are required to form the floating fate 401 due to the different structures in element-forming regions between the floating gate 401 and the selected gate areas.

SUMMARY OF THE INVENTION

It is therefore an object of the invention to provide a nonvolatile semiconductor memory device improved in reliability by preventing destruction of data caused by movements of electric charges between floating gates, and also relates to its manufacturing method.

According to the first aspect of the invention, an improved manufacturing method of a nonvolatile semiconductor memory device in accordance with a preferred embodiment of the present invention is provided, wherein the method comprises the following steps:

forming element isolation/insulation films that partition a plurality of element-forming regions in a semiconductor substrate;

stacking a first gate electrode material film and a second gate insulating film on the semiconductor substrate via a first gate insulating film;

etching the second gate insulating film and the underlying first gate electrode material film to make slits that separate the first gate electrode material film located above the element isolation/insulation films;

forming an insulating film on side surfaces of the first gate electrode material film, and stacking a second gate electrode material film;

sequentially etching the second gate electrode material film, the second gate insulating film and the first gate electrode material film in order to pattern the first gate electrode film into desired floating gates, and the second gate electrode material film patterned into control gates; and self-aligning source and drain diffusion layers with the control gates.

An improved manufacturing method of a nonvolatile semiconductor memory device is provided in accordance with another preferred embodiment of the present invention, wherein the method comprises the steps of:

forming element isolation/insulation films that partition element-forming regions in a semiconductor substrate;

stacking a first gate electrode material film on the semiconductor substrate via a first gate insulating film;

etching the first gate electrode material film to make slits that separate the first gate electrode material film located on the element isolation/insulation films;

etching surfaces of the element isolation/insulation films exposed to the slits to make recesses; stacking a second gate electrode material film on the first gate electrode material film and the element isolation/insulation films via the first gate insulating film;

sequentially etching the second gate electrode material film, the gate insulating film and the first gate electrode material film to pattern the first gate electrode material film into floating gates and pattern the second gate electrode material film into control gates; and self-aligning source and drain diffusion layers with the control gates.

According to the third aspect of the invention, an improved manufacturing method of a select gate Semiconductor device is provided in accordance with another preferred embodiment of the present invention, wherein the method comprises the steps of:

forming element isolation/insulation films that partitions element-forming regions in a semiconductor substrate;

stacking a first gate electrode material film on the semiconductor Substrate via a first gate insulating film; and forming second gate insulating films on the first gate electrode film, and second gate formed on the first gate via the second gate insulating film, and self-aligning source and drain diffusion areas with the select gate.

According to the invention, by partially etching element insulation films in the select gate area, followed by forming the first gate formed in the element-forming region and selecting the gate region via a first gate insulating film, and followed by employing a CMP (Chemical Mechanical Polish) process, both non-volatile memory floating gate and select gate device are hereby formed simultaneously.

Thereby, also when memory cells are miniaturized, the invention allows the process to be simple and reduce the defect density.

BRIEF DESCRIPTION OF THE DRAWINGS

The above objects and advantages of the present invention will become more apparent from the following detailed description of the preferred embodiments, and by reference to the attached drawings in which:

FIGS. 3A through 5B are sectional views, taken along lines III-III' (for FIGS. 3A, 4A, and 5A) and IV-IV' (for FIGS. 3B, 4B, and 5B), for illustrating a conventional method of manufacturing a nonvolatile memory device;

FIGS. 8A to 10B are sectional views taken along lines VI-VI' (for FIGS. 8A, 9A, and 10A) and VII-VII' (for FIGS. 8B, 9B, and 10B) for illustrating an improved method of manufacturing a nonvolatile memory device according to another preferred embodiment of the present invention.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

The embodiments are described below by reference to NAND type nonvolatile memory devices.

Figure 6:
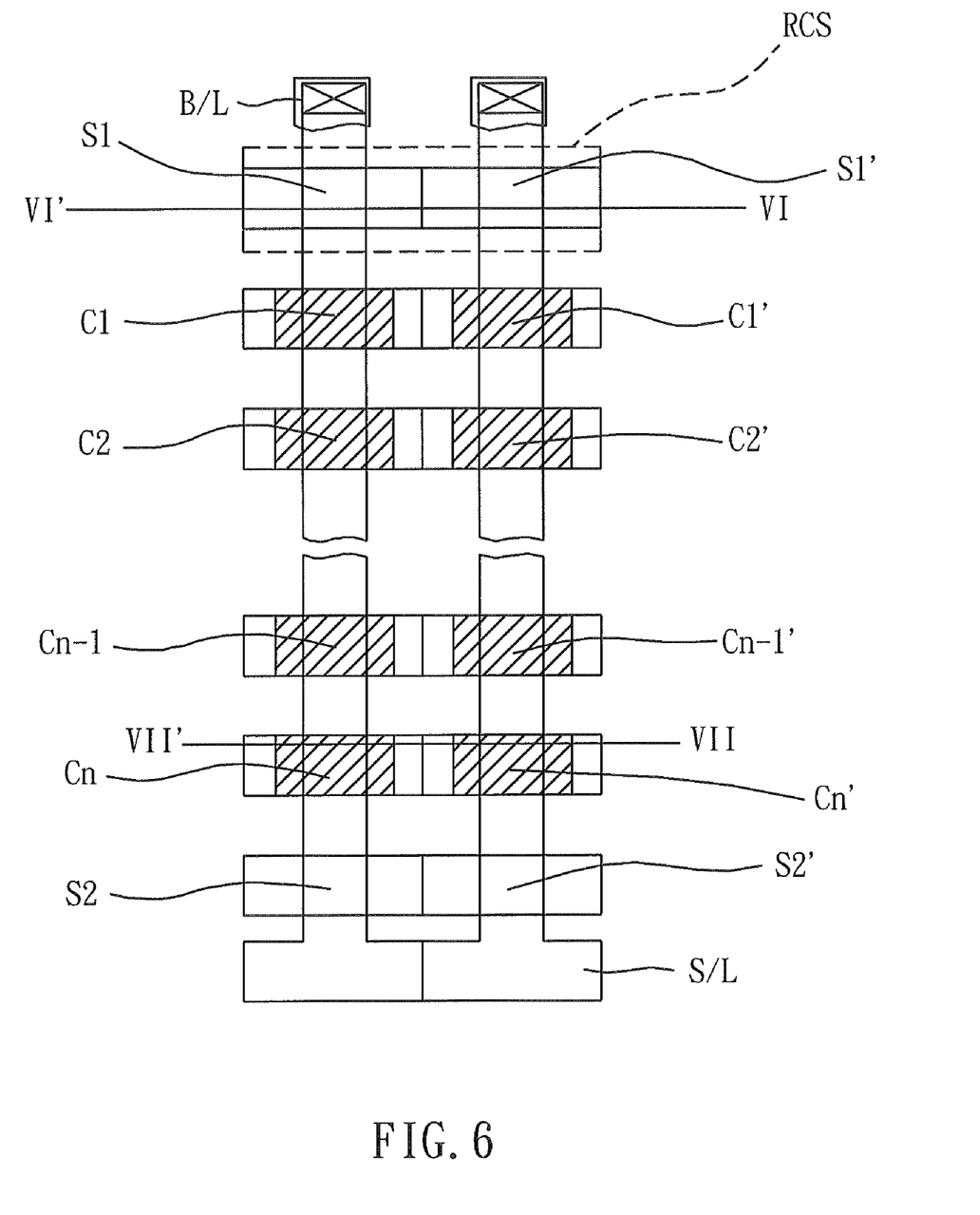
FIG. 6 is a plan view of the layout of a nonvolatile memory device according to a preferred embodiment of the present invention.
Figure 7:
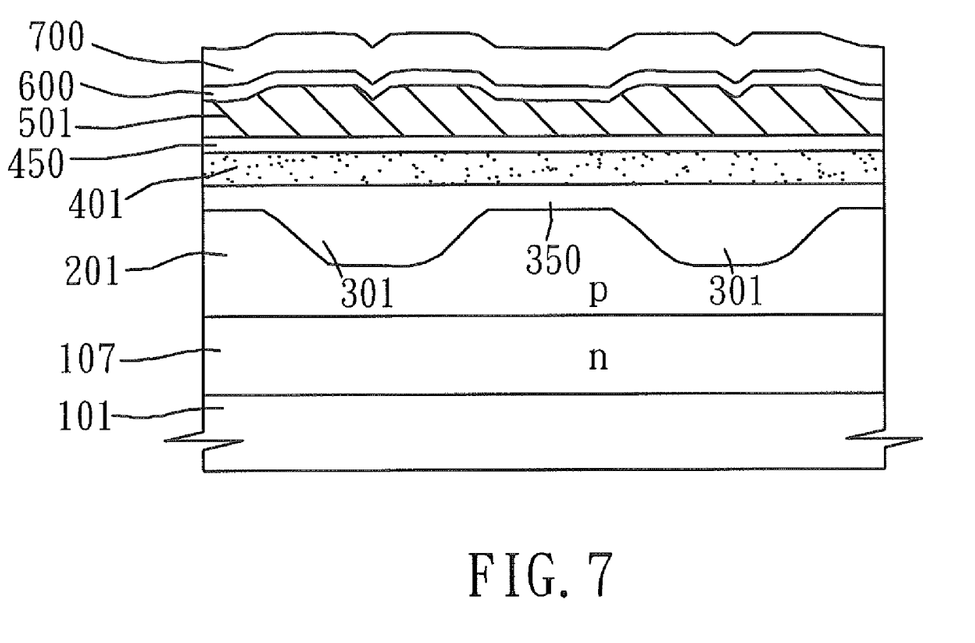
FIG. 7 is sectional view taken along line VI-VI' of FIG. 6 of a select device according to the preferred embodiment of the present invention.

FIG. 6 represents the plan view of an improved manufacturing method of a nonvolatile memory device according to a preferred embodiment of the present invention, and FIG. 7 is a sectional view taken along line VI-VI' of FIG. 6, wherein the select transistor is fabricated for the operation as the typical transistors. The floating gate 401 is formed across transistors.

In order to distinguish the select gate area, an additional mask RCS in FIG. 6 is applied for field oxide recess after isolation formation. A semiconductor substrate 101 is provided, and an ion implantation is performed at various steps so that a field oxide 301, a gate insulation 350, a floating gate 401, an inter-dielectric layer 450 and a control gate 501 are sequentially deposited. On each side of the gates, N-type (or alternatively, P-type) source/drain regions are formed. A first insulating film 600 is formed on the source/drain regions, on the sidewalls of both the floating gate 401 and the top of the control gate.

Figure 8A:
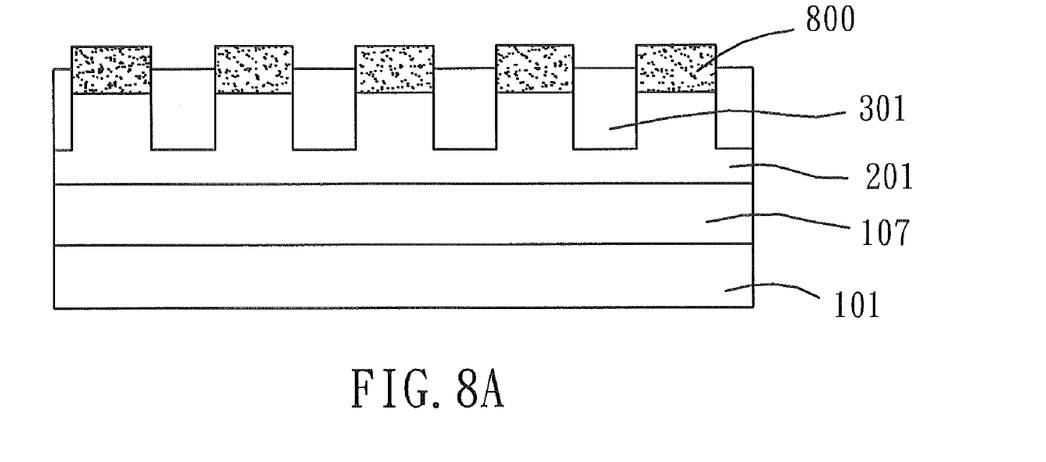

FIGS. 8A through 10B are sectional views for illustrating the manufacturing method of a select gate area according to the preferred embodiment of this invention. Here FIGS. 8A, 9A, 10A are sectional views taken along line VI-VI' of FIG. 6, and FIGS. 8B, 9B, 10B are sectional views taken along ling VII-VII' of FIG. 6. The main characteristic of this preferred embodiment of the present invention shown in FIGS. 6-8B is that the mask Recess (RCS) process is employed to form the selected gate areas and the floating gate.

Figure 8B:
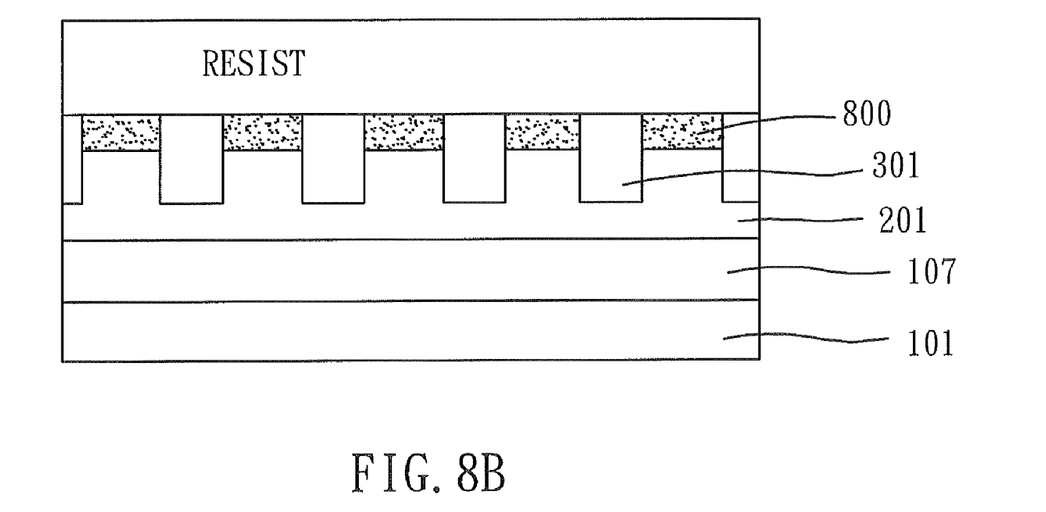

FIGS. 8A and 8B show the step of recessing the field oxide film 301 in the select gate area, while maintaining the field oxide film 301 in the floating fate area. In the select gate area in FIG. 8A, the field oxide is recessed by an additional oxide etch, while the floating gate area is covered by photo resist during the oxide recess etch. This step is inserted after STI (field trench isolation) CMP process, and before STI pad nitride 800 removal. Alternatively, the structures may be formed on an N-type portion of a semiconductor substrate without departing from the scope of this invention.

Figure 9A:
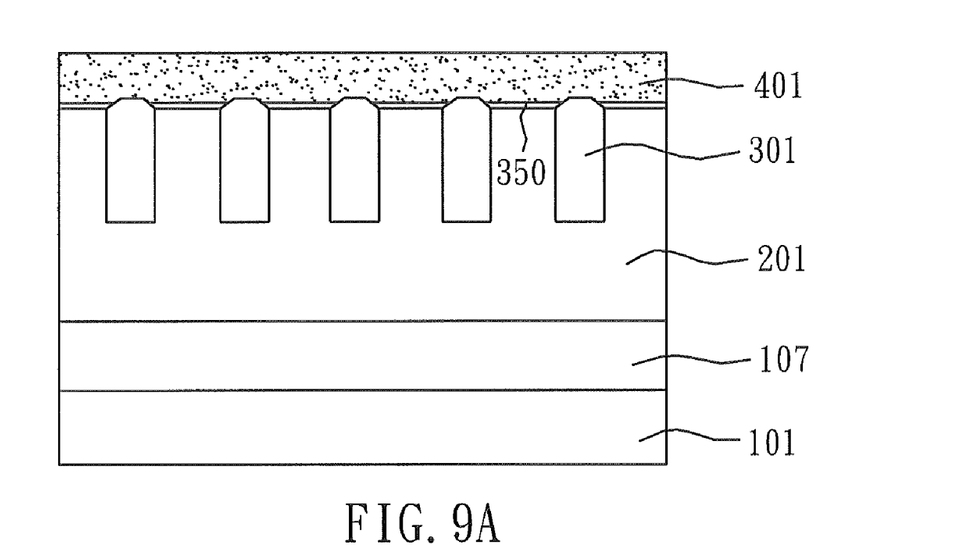
Figure 9B:
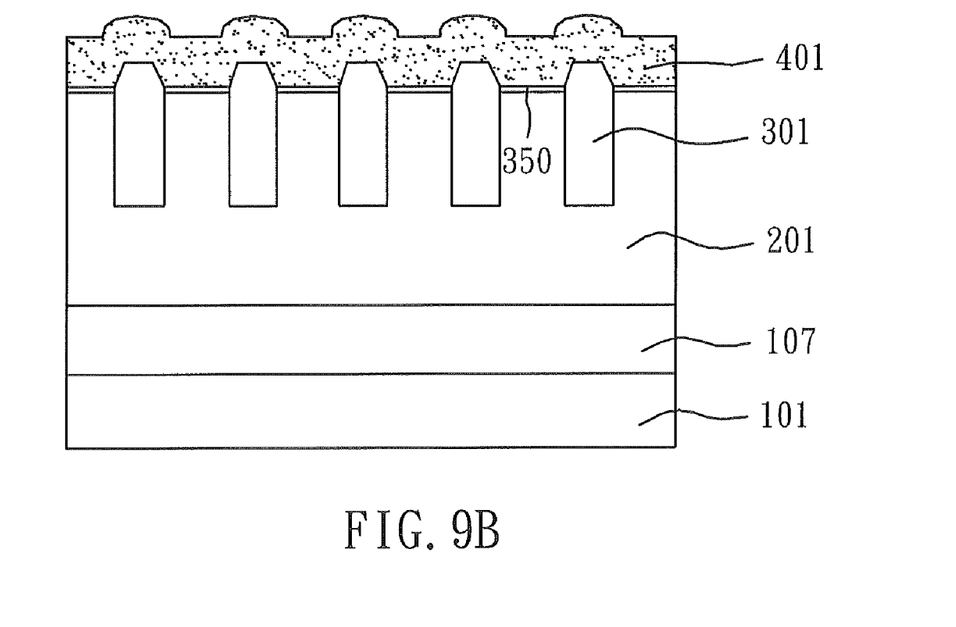

FIGS. 9A and 9B show the steps of depositing a floating gate material 401 in the select gate and floating gate area without using the mask RCS process. Due to the recess of field oxide film 301 in the select gate area, the floating gate 401 in the select gate area is relatively flat, compared to the bumpy floating gate material 401 in the floating gate area, which is taller on the top of field oxide.

Figure 10A:
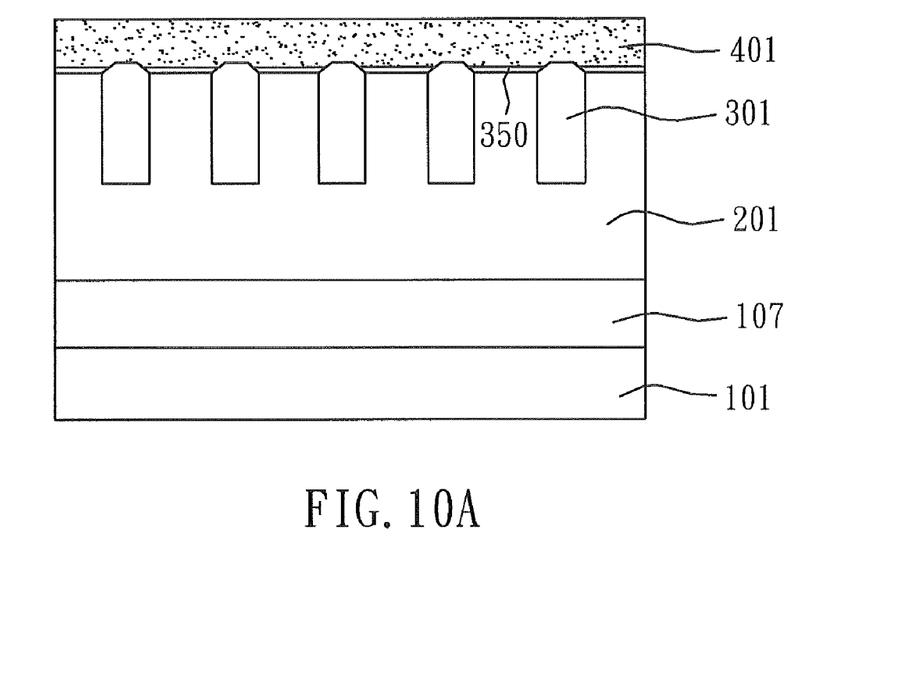
Figure 10B:
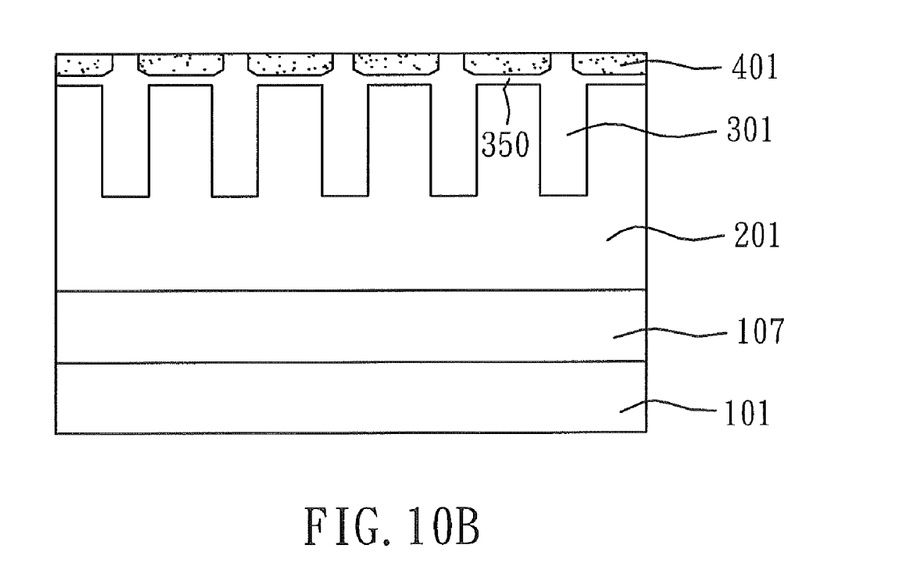

In FIGS. 10A and 10B, a chemical mechanical polish process is applied to both select gate area and floating gate area. Conductive material is used for forming the gate electrode, wherein polysilicon is used and doped with impurities, and the polysilicon is then deposited on the gate oxide film 350 and patterned by a chemical mechanical polish (CMP) process for forming a floating gate so that the formation of the floating gate 401 can be achieved. In FIG. 10A, before the formation of floating gate 401, the poly silicon 401 remains in the structure in order to function as a traditional transistor due to the recess (RCS) of field oxide process. In FIG. 10B, the poly silicon 401 is divided into isolated floating gate by the tall field oxide (or STI) in the floating gate area to form the floating gate 401 in FIG. 10B. An insulation film is thereby deposited on the floating gate 401 such as a sequentially deposited oxide film, nitride film and oxide film (ONO film), to thereby form the inter-dielectric layer 450. The inter-dielectric layer 450 insulates the floating gate and select gate from the control gate 501, and it acts as a dielectric layer over the floating gate to control. The subsequent process will be thereafter identical to the prior art as mentioned in FIGS. 1 to 5, but not limited to.

What is claimed is:

1. A method for manufacturing a non-volatile semiconductor memory device structure, comprising:
    forming element isolation/insulation films that partition element-forming regions and selecting gate areas in a semiconductor substrate;
    dividing and separating a plurality of floating gates, wherein the process comprising:
    forming a field oxide film by a shallow trench isolation (STI) method for dividing the semiconductor substrate into an active region and a non-active region;
    applying a mask Recess (RCS) to cover the element-forming regions before removing a STI pad nitride in the shallow trench isolation(STI) method, and thereby performing an additional oxide etch for recessing the field oxide film in the select gate areas;
    removing the mask RCS and the STI pad nitride;
    depositing a first gate insulating film and a floating gate material in sequence on the semiconductor substrate;
    applying a chemical mechanical polish(CMP) process to both the element-forming regions and select gate areas for dividing the floating gate material into isolated floating gates in the element-forming regions, wherein the floating gate material in the select gate areas is continuous;
    forming a second gate insulating film on said isolated floating gates and said floating gate material;
    forming control gates on said isolated floating gates and said floating gate material via said second gate insulating film; and
    self-aligning source and drain diffusion layers with said control gates.

2. The method according to claim 1, wherein the height of the field oxide film is increased when the thickness of the STI pad nitride is increased.

3. The method according to claim 1, wherein the reduction of the height of the field oxide film is performed by a wet etching process.

4. The method according to claim 1, wherein the reduction of the height of the field oxide film is performed by a dry etching process.

* * * * *